United States Patent [19]
Knaack

[11] Patent Number: 6,023,777
[45] Date of Patent: Feb. 8, 2000

[54] TESTING METHOD FOR DEVICES WITH STATUS FLAGS

[75] Inventor: Roland T. Knaack, Starkville, Miss.

[73] Assignee: Cypress Semiconductor Corp., San Jose, Calif.

[21] Appl. No.: 08/712,372

[22] Filed: Sep. 11, 1996

[51] Int. Cl.[7] .................................................. G06F 11/00
[52] U.S. Cl. ......................................... 714/718; 365/201
[58] Field of Search .................................. 371/21.1, 21.2, 371/40.4, 46, 27.5; 364/489; 395/183.06, 183.03, 183.08, 183.13; 714/5, 27, 29, 32, 42, 718, 726, 733, 730; 365/201

[56] References Cited

U.S. PATENT DOCUMENTS

| | | | |
|---|---|---|---|
| 4,802,122 | 1/1989 | Auvinen et al. | 365/154 |
| 4,839,866 | 6/1989 | Ward et al. | 365/221 |
| 4,875,196 | 10/1989 | Spaderna et al. | 365/238 |
| 4,891,788 | 1/1990 | Kreifels | 365/49 |
| 5,084,837 | 1/1992 | Matsumoto et al. | 395/250 |
| 5,088,061 | 2/1992 | Golnabi et al. | 365/189.01 |
| 5,175,836 | 12/1992 | Morgan | 395/425 |
| 5,228,002 | 7/1993 | Huang | 365/221 |
| 5,262,996 | 11/1993 | Shiue | 362/221 |
| 5,305,253 | 4/1994 | Ward | 365/73 |
| 5,311,475 | 5/1994 | Huang | 365/221 |
| 5,317,756 | 5/1994 | Komatsu et al. | 395/800 |
| 5,367,486 | 11/1994 | Mori et al. | 365/189.05 |
| 5,404,332 | 4/1995 | Sato et al. | 365/201 |
| 5,406,273 | 4/1995 | Nishida et al. | 340/825.51 |
| 5,406,554 | 4/1995 | Parry | 370/58.1 |
| 5,426,612 | 6/1995 | Ichige et al. | 365/220 |
| 5,467,319 | 11/1995 | Nusinov et al. | 365/231 |
| 5,490,257 | 2/1996 | Hoberman et al. | 395/427 |
| 5,506,809 | 4/1996 | Csoppensky et al. | 365/221 |
| 5,513,318 | 4/1996 | van de Goor et al. | 395/185.01 |
| 5,521,876 | 5/1996 | Hattori et al. | 365/221 |
| 5,546,347 | 8/1996 | Ko et al. | 365/221 |
| 5,550,749 | 8/1996 | Dey et al. | 364/489 |
| 5,617,531 | 4/1997 | Crouch et al. | 395/183.06 |
| 5,642,318 | 6/1997 | Knaack et al. | 365/201 |

FOREIGN PATENT DOCUMENTS

| | | |
|---|---|---|
| 0113996 | 8/1989 | Japan . |
| 0676559 | 6/1994 | Japan . |

*Primary Examiner*—Robert W. Beausoliel, Jr.
*Assistant Examiner*—Nadeem Iqbal
*Attorney, Agent, or Firm*—Christopher P. Maiorana, P.C.

[57] ABSTRACT

The present invention provides a design method and apparatus for improving the testing of devices having status flags that indicate when particular boundary conditions are met. The present invention enables a subset of the overall device architecture that requires much less testing and vector analysis to fully analyze the device characteristics. The smaller subset of the device maximizes the number of in-depth analysis tests that can be run to provide a reliable tested device. After the tests are run on the smaller subset of the device, a smaller subset of tests may be executed on the entire full depth array with confidence that the in-depth tests have been previously executed. The present invention method and apparatus can be enabled during design, device characterization and production test phases of the product.

20 Claims, 2 Drawing Sheets

TESTING METHOD FOR DEVICES WITH STATUS FLAGS

FIELD OF THE INVENTION

The present invention relates to memory devices generally, and more particularly, to a design method to configure a high density part as a low density part for performing various tests prior to running a smaller subset of tests on the entire memory.

BACKGROUND OF THE INVENTION

Memory devices, in particular first-in first-out (FIFO) buffers, typically employ a variety of status flags including empty, full, half-full, almost full, almost empty and cascade. The various flags indicate when certain conditions are met. During the testing of such a device, the various flags make it more difficult to provide thorough, fine grained, testing of the device. In particular, with increased density designs in order to fully simulate the schematic database of the device, the entire depth of the device must be accessed and tested. In the case where the device has a status flag that activates at one particular end of the device exclusively, the entire depth of the device must be written to and/or read before a single occurrence of a particular flag is realized. There are numerous tests that need to be performed at each status flag or boundary. However, thousands of "dummy" cycles are needed to place the device into the desired condition for a single execution of the status flag. The following TABLE 1 illustrates a number of typical FIFO depths as well as status flag/boundary flag conditions:

TABLE 1

| Depths | Status Flags/Boundary |
| --- | --- |
| 256, 512, 1K, 2K, 4K | Empty, Full, Half Full, Casdade |
| 64, 256, 512, 1K, 2K, 4K, 8K | Empty, Full, Half Full, Cascade, Programmable Almost Full/Empty |
| 64, 256, 512, 1K, 2K, 4K | Empty, Full, Half Full, Cascade, Programmable Almost Full/Empty |
| 512, 1K, 2K, 4K | Empty, Full, Half Full, Cascade, Programmable Almost Full/Empty |
| 256, 512, 1K, 2K | Empty, Full, Half Full, Cascade, Programmable Almost Full/Empty |

As can be seen from TABLE 1, even the smallest depth for certain device families will require numerous "dummy" cycles to be executed before reaching the desired boundary condition.

FIG. 1 illustrates a previous approach for configuring the device depth of a particular device by a combination of metal options and bond options. The device 10 generally comprises a size decoder block 12, a write counter 14, a read counter 16 and a status flag logic block 18. The size decoder 12 has an input 20 and an input 22 that generally receive bond options information. The size decoder block 12 presents information on a size bus 24 that is presented to an input 26 of the status flag logic block 18. The size bus 24 presents a signal on a data bus 28 that is received at an input 30 of the write counter 14. The write counter 14 also has an input 32 that receives a write clock signal WCLK. The write counter 14 presents a signal at an output 34 that is received at an input 36 of the status flag logic block 18. The size bus 24 presents a signal on a data bus 38 that is received at an input 40 of the read counter 16. The read counter 16 also has an input 42 that receives a read clock signal RCLK. The read counter 16 presents a signal at an output 44 that is received at an input 46 of the status flag logic block 18.

The width of the size bus 24 is determined by all the possible depth combinations allowed by the size decoder block 12. For example, a device with several metal options defining several families of devices (e.g., ×9, ×18, etc.) having various bond options defines the required device depth of the size bus 24. As a result, two bond options would provide four depths per metal option.

SUMMARY OF THE INVENTION

The present invention provides a design method and apparatus for improving the testing of devices having status flags that indicate when particular boundary conditions are met. The present invention enables a subset of the overall device architecture that requires much less testing and vector analysis to fully analyze the device characteristics. The smaller subset of the device maximizes the number of in-depth analysis tests that can be run to provide a reliable tested device. After the tests are run on the smaller subset of the device, a smaller subset of tests may be executed on the entire full depth array with confidence that the in-depth tests have been previously executed. The present invention method and apparatus can be enabled during design, device characterization and production test phases of the product.

The objects, features and advantages of the present invention include providing a design method for improving the testing of devices with status flags indicating certain conditions in a memory device. The present invention drastically reduces the simulation vector size, the simulation time for testing boundary flags, the characterization vector size and the time for complex fine grained shmoo plots. The present invention also reduces the extent that hardware and/or software logic analyzers will be required to capture the entire sequence of events preceding the crossing of all device status flag boundaries.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
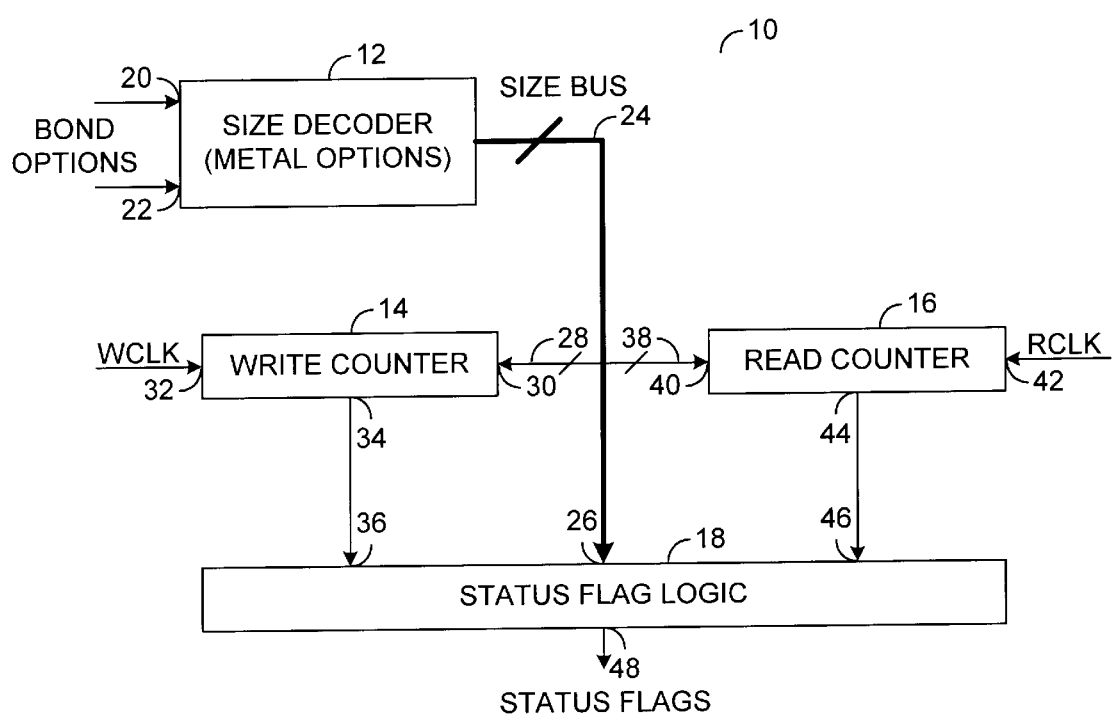
FIG. 1 is a block diagram of a previous approach for configuring the depth of a particular device.
Figure 2:
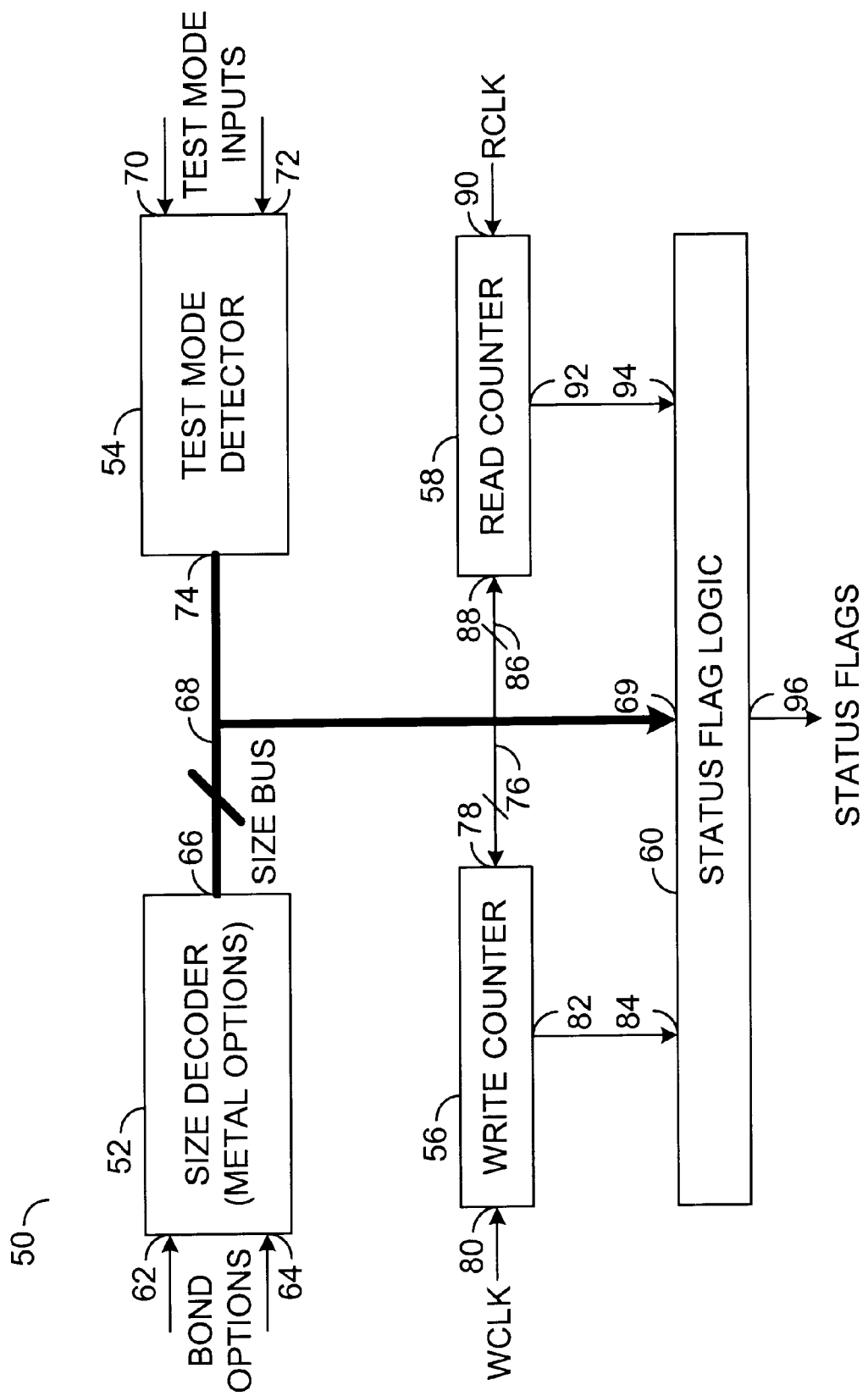
FIG. 2 is a block diagram of a preferred embodiment of the present invention.

Referring to FIG. 2, a block diagram of a device 50 is shown in accordance with a preferred embodiment of the present invention. The device 50 generally comprises a size decoder 52, a test mode detector 54, a write counter 56, a read counter 58 and a status flag logic block 60. The size decoder block 52 has an input 62 and an input 64 that may receive bond option information. The size decoder block 52 has an output 66 that generally presents sizing information on a size bus 68 to an input 69 of the status flag logic block 60. The test mode detector 54 has an input 70 and an input 72 that may receive test mode inputs. The test mode detector 54 generally presents a size signal to the size bus 68 through an output 74. The write counter 56 may receive information through a data bus 76 at an input 78 from the size bus 68.

The write counter 58 also has an input 80 that may receive a write clock signal WCLK. The write counter 56 generally presents a signal at an output 82 that may be presented at an input 84 of the status flag logic block 60. The read counter 58 may receive information through a data bus 86 at an input 88 from the size bus 68. The read counter 58 also has an input 90 that may receive a read clock signal RCLK. The read counter 58 generally presents a signal at an output 92 that may be received at an input 94 of the status flag logic block 60. The status flag logic block 60 generally presents status flag information at an output 96 that may be used to simulate and characterize a reduced depth device.

It is generally desirable to run a large number of fine grain simulations to insure that the device being tested does not have any asynchronous hazards. The number of simulations necessary to insure such accuracy may be in the billions of cycles and may take many hours to complete. The time necessary to complete such an in-depth analysis is generally undesirable in view of the current design constraints of speeding up the entire design and production cycle time.

The test mode detector 54 provides additional information to the size bus 68 so that the testing equipment (not shown) treats the memory device as a smaller depth memory array than is actually implemented on the device. This allows for the in-depth status flag testing of the device to be performed on a smaller portion of the device, which greatly reduces the number of simulations that must be run to provide reliable testing. The following TABLE 2 illustrates a variety of depth bond options for an example device:

TABLE 2

| | | Depth Bond Options | | | |
|---|---|---|---|---|---|
| Width | Metop | size 1<br>Bpad1: 0<br>Bpad2: 0 | size 2<br>Bpad1: 1<br>Bpad2: 0 | size 3<br>Bpad1: 0<br>Bpad2: 1 | size 4<br>Bpad1: 1<br>Bpad2: 1 |
| x18 | 1 | 256 | 2K | 1K | 512 |
| x9 | 3 | 4K | 2K | 1K | 512 |
| x9 | 5 | 4K | 2K | 1K | 512 |

TABLE 2 illustrates various sized buffers that may be manufactured from a single parent die. The column headings indicate the various bond pad options. Specifically, the first column indicates that the bond pad option Bpad1 is equal to 0 and the bond pad option Bpad2 is also equal to 0. The two bond pad options provide a 2-bit input that may select between the four sizes indicated. For example, in the first column, both the bond pad options Bpad1 and Bpad2 are equal to 0. The column labeled Metop indicates additional metal options. When the signal Bpad1 and Bpad2 are both equal to 0 and the Metop is equal to 1, the depth of the buffer will be 256 words as indicated.

The following TABLE 3 illustrates additional depth bond options:

TABLE 3

| | | Depth Bond Options | | | |
|---|---|---|---|---|---|
| Width | Metop | size1<br>Bpad1:0<br>Bpad2:0 | size2<br>Bpad1:1<br>Bpad2:0 | size3<br>Bpad1:0<br>Bpad2:1 | size4<br>Bpad1:1<br>Bpad2:1 |
| x18 | 1 | 512 | 4K | 2K | ▓ |
|  | 2 | ▓ | 512 | 256 | 64 |
| x9 | 3 | 8K | 4K | 2K | 1K |
|  | 4 | 1K | 512 | 256 | 64 |
| x9 | 5 | 8K | 4K | 2K | 1K |
|  | 6 | 1K | 512 | 256 | 64 |

TABLE 3 adds the addition of two Metop options per width option. As a result when both the signal Bpad1 and Bpad2 are equal to 0 the Metop option can be selected as either a "1" to produce a 512-bit word or a "2" to indicate a 1K-bit word device. TABLES 2 and 3 illustrate the various size FIFOS that may be implemented on a single parent die. When the signal Bpad1 and Bpad2 are equal to one and the Metop option is a "1", the example device size is shown to be 1K. When the signal Bpad1 and Bpad2 are equal to zero and the Metop option is a "2", the example device size is again shown to be 1K. One of these redundant configurations may be used to implement a smaller device size for testing purposes.

The general configuration of a memory buffer uses a write clock that may be ahead of the read clock by 4 ns or more which may decrease to, for example, 3 ns, then 2 ns, then ins and finally the write clock may be behind the read clock. In real time the write clock is sliding through the read clock edge. The term used in the art for this technique is called "shmooing". Shmoo plots are generally run for intensive analysis to be certain that this real time sliding of the clock edges does not adversely affect the performance of the memory array. The status flag generation circuitry in all the logic elements should be able to keep up, not glitch and continue to present a proper status flag of the FIFO at all points and times when that particular clock is shmooing through the opposite clock. From a practical standpoint, testing a memory device using in-depth shmoo plots requires the additional testing described previously. As such, the present invention is directly applicable to reducing the testing time necessary to properly run shmoo plots. If finer grain shmoo plots are desired, even more testing may need to be run. For example, if the write clock is ahead of the read clock by, for example, 5 ns, many testing passes, perhaps in the billions, may need to be run to verify the correct operation of the flags at this interval. If a fine grain shmoo is desired, the next interval may be, for example, 4.9550 ns. Several more billion cycles may then need to be run to verify this interval. For this type of fine grain testing, each interval, within the acceptable range, may need to be run and verified in order to have assurance that an asynchronous hazard is not present at a particular write clock to read clock relationship. By reducing the word size to, for example, 64 words, the number of cycles may be reduced to less than a thousand, or even to less than a hundred.

Another testing problem arises when multiple voltages need to be run at each particular fine grain shmoo. For example, if more than a two voltage level system is tested, the testing required to verify an asynchronous hazard has not occurred increases.

Modern memory devices have word depths in the range of, for example, 1K, 2K, 4K and 8K. However, future designs already contemplate 64K and 128K deep memories as the next generation of FIFO devices. The present invention is useful for reducing the testing on an 8K as well as the smaller depths device. However, when extending the device to 128K, the present invention provides superior results. After the tests are run using the present invention, a smaller subset of tests may be executed on the entire full depth array with confidence that the in-depth tests have been previously executed.

The size signal presented on the size bus 68 from the test mode detector 54 may be programmed using various methods including, for example, programming a register by a user providing a specific program sequence (e.g., a write program register instruction or an execution). The size signal may be generated by allowing the user to dynamically specify the sizing information. The signal may have a dedicated pin on the output of the package. A high voltage detection could also be implemented to generate the size signal. Other means to provide the size signal may be used according to the design criteria of a particular application.

While the invention has been particularly shown and described with reference to preferred embodiments thereof, it will be understood by those skilled in the art that various changes in form and details may be made without departing from the spirit and scope of the invention.

I claim:

1. A device for reducing testing time of a memory device having a word depth, comprising:

means for testing a memory device; and means for providing testing information to said means for testing, said testing information providing a configuration signal that reduces the word depth of the memory device and the testing time.

2. The circuit according to claim 1 wherein said testing information comprises a characterization/simulation vector having a size, and said means for providing reduces said characterization/simulation vector size.

3. The circuit according to claim 1 wherein said means for providing analyzes a set of boundary/status flags indicating one or more particular conditions of said memory device.

4. The circuit according to claim 3 wherein said boundary/status flags include one or more empty flags, full flags, half full flags, almost full flags, almost empty flags or cascade flags.

5. The circuit according to claim 1 wherein said configuration signal is implemented during a fabrication process of said memory device.

6. The circuit according to claim 1 wherein said reduced word depth is less than 8K.

7. The circuit according to claim 1 wherein said reduced word depth is less than 16 words.

8. The circuit according to claim 7 wherein said means for providing reduces a number of testing cycles in a shmoo simulation.

9. A device for testing a memory device comprising:

a first circuit configured to test said memory device; and a second circuit configured to generate and provide testing information to said first circuit, said testing information comprising a configuration signal that reduces a word depth of the memory device and a testing time for the memory device.

10. The circuit according to claim 9 wherein said second circuit reduces a characterization/simulation vector size.

11. The circuit according to claim 9 wherein said second circuit analyzes a set of boundary/status flags indicating a particular condition of said memory device.

12. The circuit according to claim 11 wherein said boundary/status flags include one or more empty flags, full flags, half full flags, almost full flags, almost empty flags and cascade flags.

13. The circuit according to claim 9 wherein said second circuit is implemented during a fabrication process of said memory.

14. The circuit according to claim 9 wherein said reduced word depth is less than 8K.

15. The circuit according to claim 9 wherein said reduced word depth is less than 16 words.

16. The circuit according to claim 9 wherein said second circuit reduces a number of testing cycles in a shmoo simulation.

17. A method for testing a memory device comprising:

generating testing information that provides a reduced word depth configuration signal for improving a testing time, and testing a reduced word depth portion of said memory device with said reduced word depth configuration signal.

18. The method according to claim 17 wherein said generating step reduces a characterization/simulation vector size.

19. The method according to claim 17 further comprising analyzing a set of boundary flags.

20. The method according to claim 19 wherein said boundary flags comprise one or more empty flags, full flags, half full flags, almost full flags, almost empty flags or cascade flags.

* * * * *